United States Patent [19]

Hong

[11] Patent Number: 5,933,722
[45] Date of Patent: Aug. 3, 1999

[54] METHOD FOR MANUFACTURING WELL STRUCTURE IN INTEGRATED CIRCUIT

[75] Inventor: Gary Hong, Hsinchu, Taiwan

[73] Assignee: United Microelectronics Corp., Taiwan

[21] Appl. No.: 09/009,735

[22] Filed: Jan. 21, 1998

[30] Foreign Application Priority Data

Nov. 14, 1997 [TW] Taiwan ................................. 86116973

[51] Int. Cl.⁶ ............................................. H01L 21/8238
[52] U.S. Cl. ......................... 438/232; 438/223; 438/228; 438/229
[58] Field of Search ..................................... 438/223, 224, 438/225, 227, 228, 229, 230, 231, 232

[56] References Cited

U.S. PATENT DOCUMENTS

| | | | |
|---|---|---|---|
| 4,295,897 | 10/1981 | Tubbs et al. ............................ | 438/229 |
| 4,325,169 | 4/1982 | Ponder et al. ........................... | 438/232 |
| 4,434,543 | 3/1984 | Schwabe et al. ........................ | 438/228 |
| 4,435,896 | 3/1984 | Parrillo et al. .......................... | 438/232 |
| 4,516,316 | 5/1985 | Haskell .................................. | 438/228 |
| 5,627,099 | 5/1997 | Sasaki .................................... | 438/228 |
| 5,744,372 | 4/1998 | Bulucea .................................. | 438/232 |
| 5,795,802 | 8/1998 | Ko et al. ................................. | 438/228 |

*Primary Examiner*—Charles Bowers
*Assistant Examiner*—Jack Chen
*Attorney, Agent, or Firm*—Rabin & Champagne, P.C.

[57] ABSTRACT

A method for forming a well structure in an integrated circuit such that, without any additional masking steps, the well implantation can be performed before the definition of the active device area. Hence, besides being able to avoid problems caused by a low breakdown voltage, also can provide a self-alignment mark for subsequent mask alignment, thereby reducing misalignment errors.

10 Claims, 4 Drawing Sheets

METHOD FOR MANUFACTURING WELL STRUCTURE IN INTEGRATED CIRCUIT

CROSS-REFERENCE TO RELATED APPLICATION

This application claims the priority benefit of Taiwan application Ser. No. 86/116,973, filed Nov. 14, 1997, the full disclosure of which is incorporated herein by reference.

BACKGROUND OF THE INVENTION

1. Field of Invention

The present invention relates to a method for manufacturing a well structure for integrated circuits. More particularly, the present invention relates to a method of forming a well in the integrated circuit before the definition of active device areas.

2. Description of Related Art

There are two types of devices in an integrated circuit, namely, a logic device and a memory device. Logic devices are used for carrying out the computation of logic functions, for example, in the microprocessor of a personal computer. On the other hand, memory devices, for example, random access memories (RAMs), are used for storing digital data. As a microprocessor becomes functionally more powerful, software programs that can be executed also can be very large. Hence, the storage capacity of memory must correspondingly be increased.

At present, most semiconductor storage devices, for example, dynamic random access memories (DRAMs) are made from complementary metallic oxide semiconductor (CMOS) transistors. As the level of integration for semiconductors is increased, the use of CMOS transistors is going to be much common. The design of a CMOS involves three types of structural formation, namely: an N-well, a P-well and a twin well. Among the three, N-well and P-well are single well construction. Due to the need for a high level of integration, the dimensions of a device are constantly decreased.

When the feature linewidth of a device has fallen to below 1 µm, because of the short-channel effect, field intensity inside the channel region will be increased. Consequently, the operational characteristics of a P-type MOS transistor and an N-type MOS transistor is approaching each other. Therefore, a more suitable choice for sub-micron technologies will be to use CMOS transistors with a twin well structure.

FIGS. 1A through 1D are cross-sectional views showing the progression of manufacturing steps in forming a conventional twin well structure. First, as shown in FIG. 1A, photolithographic and etching techniques are used to pattern PMOS 11 and NMOS 12 active areas on the <100> surface of a P-type substrate 10, which has a resistivity of about 8 to 12 Ω-cm. The substrate 10 further includes a pad oxide layer 13, and silicon nitride layers 14 and a patterned photoresist layer 15 for patterning the substrate 10. Next, the photoresist layer 15 is removed.

Then, using a photolithographic process, a photoresist layer 16 is formed over the substrate 10, and patterned to cover only the area 12 where the N-MOS transistor will be placed as shown in FIG. 1B. Next, impurity ions 17, for example, phosphorus ion, for forming the N-type semiconductor are implanted into the exposed substrate 10 as shown in FIG. 1C. Since the energy used for implanting ions to form the N-well is high and the combined thickness of the silicon nitride layer 14 and the pad oxide layer 13 is rather thin (below about 2500 Å), N-type ions will be able to penetrate through these two layers and end up in the substrate. The energy level used in the N-type ion implant is about 200 to 500 KeV and the dosage level is about $1.0 \times 10^{13}$ to $3.0 \times 10^{13}/cm^2$.

In a subsequent step, the photoresist layer 16 is removed, and then the wafer is placed in a furnace and then raised to a temperature of about 1000° C. to allow the doped impurities to drive into the substrate through diffusion. The resulting N-well concentration profile 18 is shown in FIG. 1D.

In the aforementioned conventional method, patterning of the active area is carried out prior to performing the implant operation. This is because the pattern on the active area can serve as an alignment layer in the well implant operation. In other words, because the well implantation operation itself cannot generate an alignment mark, no well implantation operation can be carried out before the definition of the active area. However, in order to allow the impurity ions to pass through the silicon nitride/pad oxide layers into the substrate successfully, a higher level of implant energy needs to be supplied.

The problem of high-energy implant is that the impurity ions will cause damages to the substrate surface. In addition, the nitride and oxygen atoms that are bombarded upon will be forced into the substrate surface and further causing additional defects on the substrate layer. Damages or defects in the substrate will lower the charge-to-breakdown ($Q_{BD}$) voltage of the subsequently formed gate oxide layer over the substrate, and a low $Q_{BD}$ lowers the reliability of the integrated circuit device.

In light of the foregoing, there is a need to provide an improved method of manufacturing a twin well structure in an integrated circuit.

SUMMARY OF THE INVENTION

Accordingly, the present invention is to provide an alignment mark in the substrate, without an additional masking step, after the well implantation operation such that the well implantation operation can be finished before the definition of the active area. Consequently, the energy level used in the well implantation operation can be somewhat lower, and hence able to prevent the low breakdown voltage in a conventional method. Therefore, related reliability problems due to a low breakdown voltage can be avoided.

To achieve these and other advantages and in accordance with the purpose of the invention, as embodied and broadly described herein, the invention provides a method for forming a well structure in an integrated circuit. The method is to perform a well implantation operation, which is carried out without an additional masking step, before the definition of the active area. Besides avoiding the problems due to a low breakdown voltage, the provision of an alignment mark in this method is also able to prevent alignment errors.

The method comprises of providing a silicon substrate, and then forming an oxide layer over the substrate. Next, a photoresist layer is formed over the oxide layer and then patterned. Consequently, a portion of the photoresist layer will remain over a first area, while other areas where photoresist layer does not covered will form a second area. Next, phosphorus ions are implanted into the exposed substrate in the second area to form a well. Thereafter, the photoresist layer is removed.

An oxide layer is then formed over the surface of the second area by a thermal oxidation method. Next, the oxide layer in the first area and the thermally formed oxide layer in the second area are removed to make the top surface of the substrate in the first area slightly higher than in the second area. Finally, a pad oxide layer and a silicon nitride layer are formed above the substrate, and then the silicon nitride layer is patterned. The area covered by silicon nitride after patterning becomes an active device area. Lastly, conventional techniques can be used to complete the formation of, for example, NMOS, PMOS or CMOS device structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
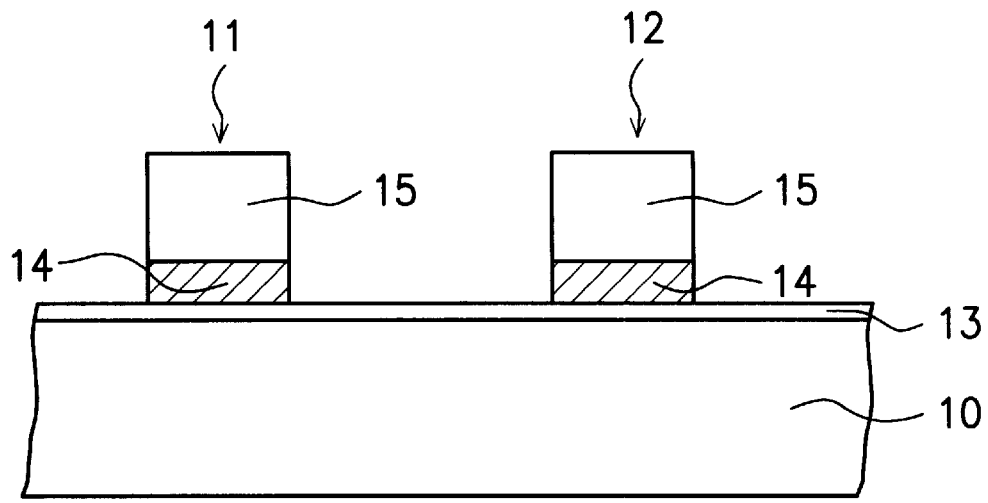
FIGS. 1A through 1D are cross-sectional views showing the progression of manufacturing steps in forming a convention twin well structure in an integrated circuit.
Figure 1B:
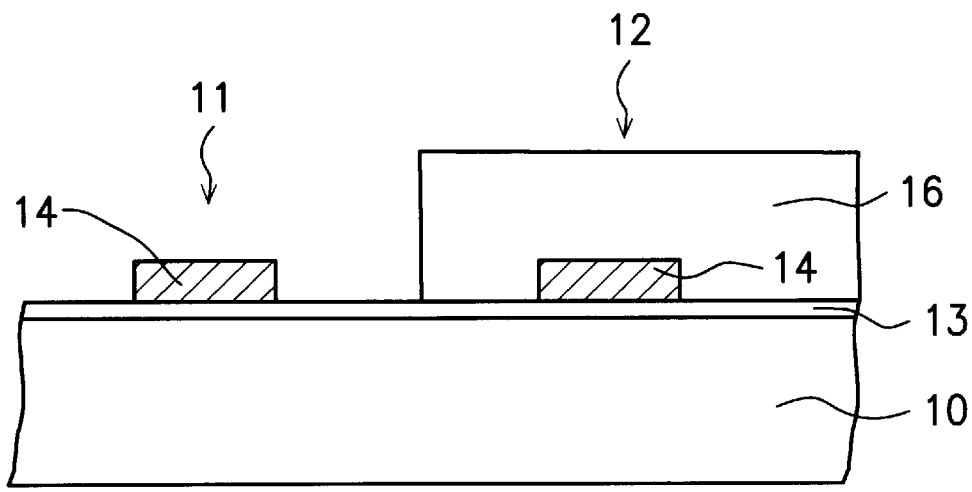
Figure 1C:
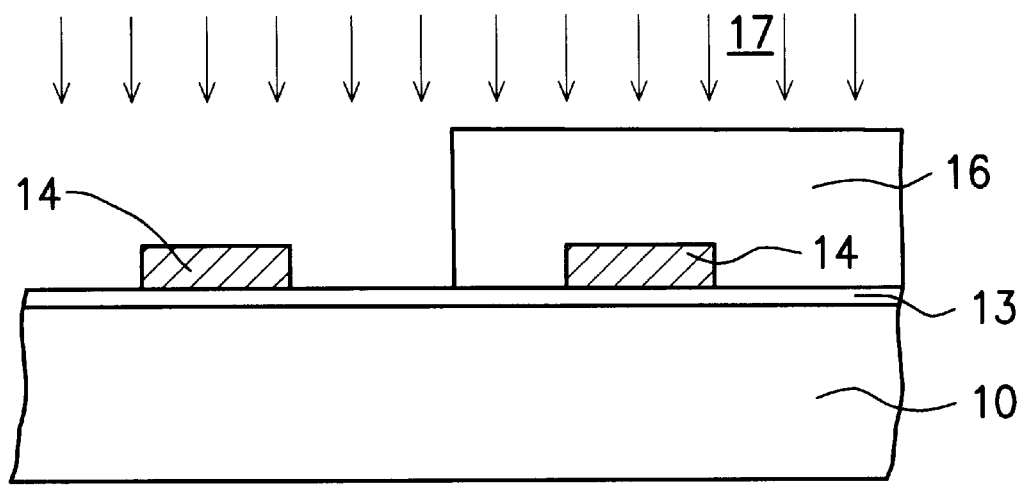
Figure 1D:
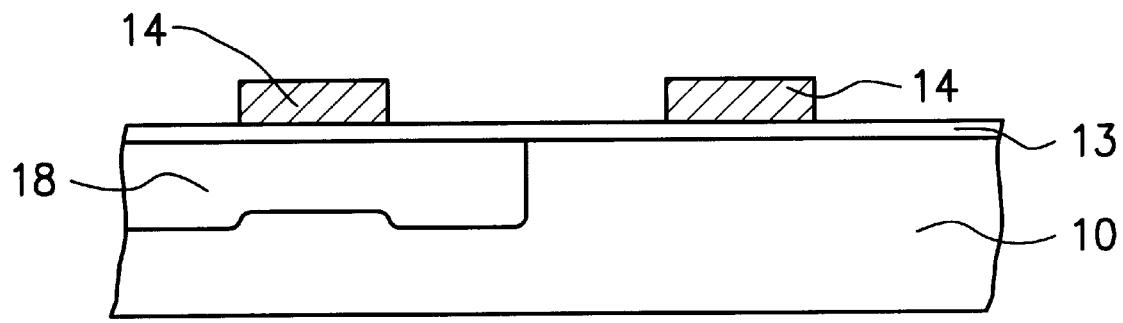

Reference will now be made in detail to the present preferred embodiments of the invention, examples of which are illustrated in the accompanying drawings. Wherever possible, the same reference numbers are used in the drawings and the description to refer to the same or like parts.

There are several conventional methods for forming a well structure, but the methods are common in that various masks and masking steps are used for forming P-type or N-type wells. In addition, most of the conventional method will produce rough surface structures, which will interfere with the quality of the subsequently formed layers. The reason for the difference in quality is due to the large focusing depth needed for exposure in a photolithographic operation, which can be difficult to achieve.

Another method includes using a thicker photoresist layer, and then performing a self-aligned twin well manufacturing operation after an isolation process. However, it is difficult to control the deposition of a photoresist layer such that a uniform thickness is formed everywhere on the wafer. Moreover, ion implant operation will cause some shrinkage in the photoresist layer, and hence will distort the depth of focus and change the desired implantation profile.

FIGS. 2A through 2F are cross-sectional views showing the progression of manufacturing steps in forming a twin well structure in an integrated circuit according to one preferred embodiment of this invention.

Figure 2A:
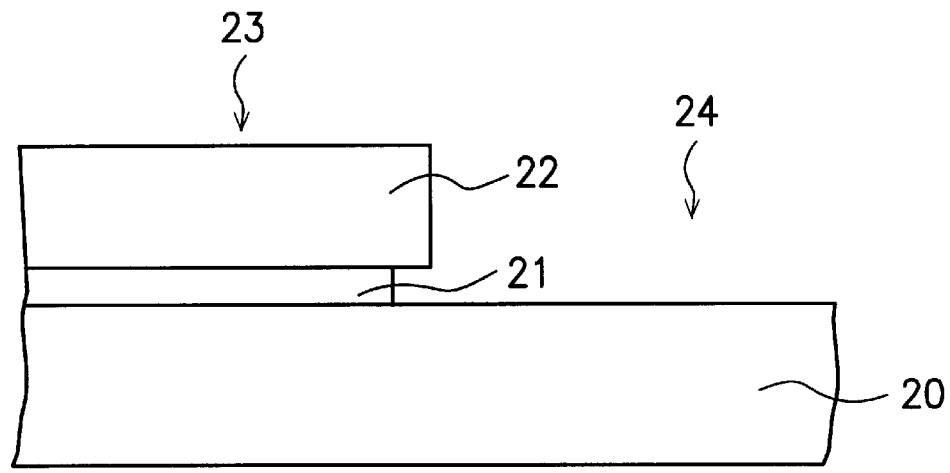
FIGS. 2A through 2F are cross-sectional views showing the progression of manufacturing steps in forming a twin well structure in an integrated circuit according to one preferred embodiment of this invention.

First, as shown in FIG. 2A, an oxide layer 21 is formed over a P-type silicon substrate 20. The oxide layer 21 preferably having a thickness of about 800 Å to 3000 Å is formed using, for example, a chemical vapor deposition (CVD) method or a thermal oxidation method. Next, a photoresist layer 22 is formed over the oxide layer, and then the photoresist layer 22 is used to pattern the oxide layer. After patterning, the oxide layer 21 covers a first area 23 while exposing the substrate in a second area 24.

The step of using a patterned photoresist layer 22 to remove a portion of the oxide layer includes a buffered hydrofluoric acid (BHF) solution wet etching operation. Since a wet etching method is an isotropic etching operation, the etched oxide layer 21 will have a pattern slightly smaller than the original photoresist pattern 22.

Figure 2B:
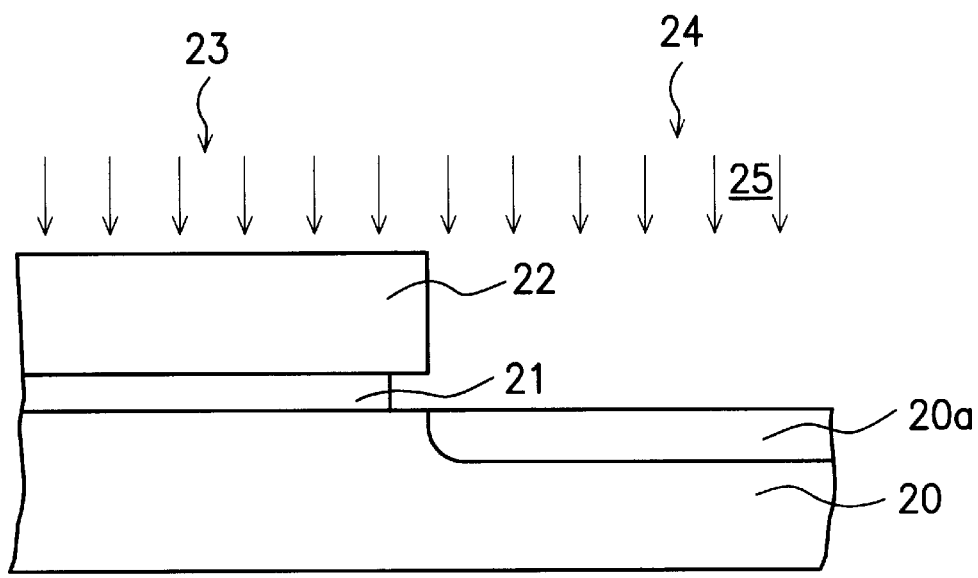

Next, as shown in FIG. 2B, using the photoresist layer 22 and the oxide layer 21 as a mask, ions 25 are implanted into the substrate 20. For example, phosphorus ions having an energy level of between 50 to 150 KeV and an implant dosage of about $1.0 \times 10^{13}$ to $3.0 \times 10^{13}/cm^2$ is used to form an N-type well region 20a. If the implanted impurities are P-type ions such as arsenic ions, P-type well region is formed.

Figure 2C:
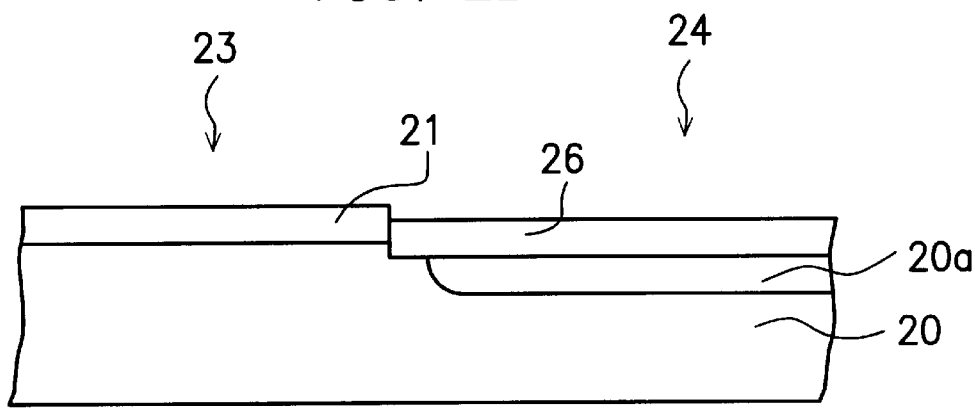

Next, as shown in FIG. 2C, the photoresist layer 22 above the oxide layer 21 is removed. Then, an oxide layer 26 preferably having a thickness of about 300 Å to 1000 Å is formed over the exposed substrate 20 using, for example, a thermal oxidation method. Since part of the silicon substrate will react with oxygen during thermal oxidation, a portion of the silicon substrate will be used in the process to form the oxide layer 26. Consequently, the top surface of substrate in the second area 24 will be at a lower level than the top surface of substrate in the first area 23.

Furthermore, since the thermally formed oxide layer 26 is thinner than the original oxide layer 21, the top surface of the thermally formed oxide layer 26 will be at a lower level than the top surface of the oxide layer 21.

Figure 2D:
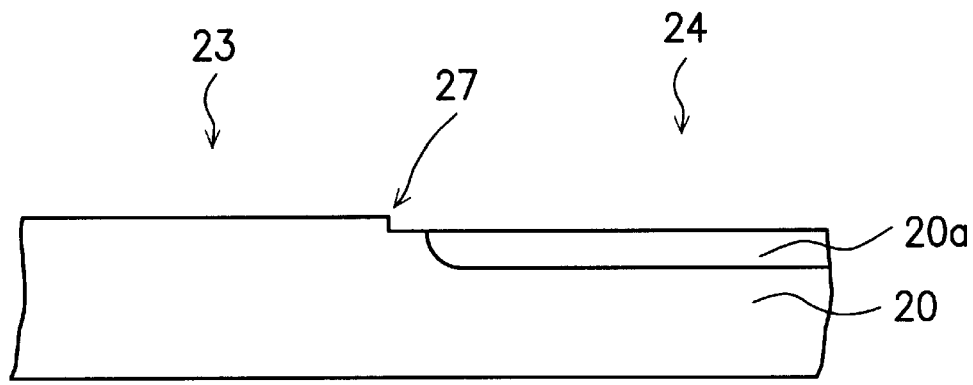

Thereafter, as shown in FIG. 2D, the oxide layer 21 and the thermally formed oxide layer 26 above the substrate 20 are removed using, for example, a wet etching method. The exposed top surface of the substrate in the second area 24 after removing the oxide layers is lower than the top surface of the substrate in the first area 23. Hence, a step 27 is formed on the substrate surface. The step 27 can be used as an alignment mark for the alignment of masks in subsequent processes, thereby reducing the probability of errors caused by a misalignment.

Figure 2E:
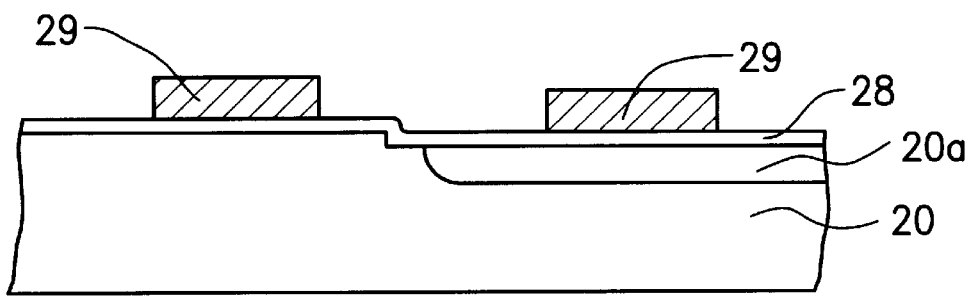

Next, as shown in FIG. 2E, a pad oxide layer 28 is formed over the exposed substrate 20 using, for example, a thermal oxidation method. The pad oxide layer serves to protect the substrate against damages during subsequent processing operations. Next, a silicon nitride layer is formed over the pad oxide layer 28, and then the silicon nitride layer is patterned to form a silicon nitride layer 29. Areas that are covered by the silicon nitride layer 29 become the active device areas.

Figure 2F:
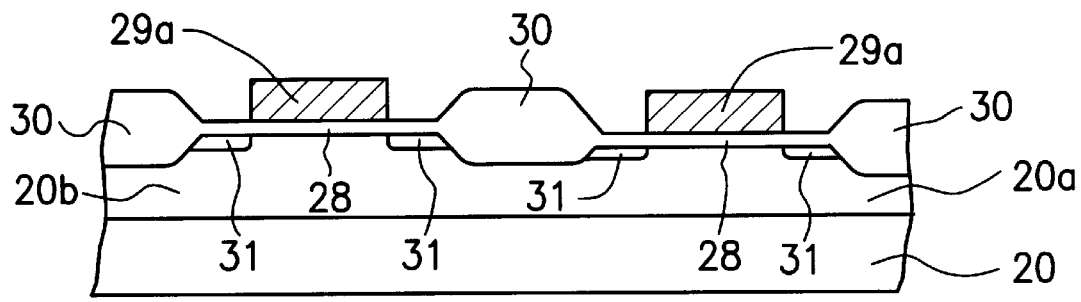

Subsequently, conventional processing operations are used to form the remaining parts of the device structure such as a CMOS structure as shown in FIG. 2F. The CMOS structure includes an N-type well region 20a, a P-type well region 20b, device isolation regions 30 formed by a thermal oxidation method, and source/drain regions 31 in the substrate on two sides of the silicon nitride layers 29a.

In this embodiment, the formation of a step alignment mark in a thermal oxidation operation after the well implantation operation enables the definition of active device region in a later stage. Consequently, there is no need to use high-energy ion implant process because there is no thick barrier layers to penetrate such as the oxide layer and silicon nitride layer formed over a defined active device region in a conventional method. Therefore, a lower energy level for implanting ions can be used, and so device reliability problems caused by a low breakdown voltage can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a well structure in an integrated circuit, comprising:

provulating a substrate having an oxide layer formed directly, and without any intervening layers, thereon;

coating and patterning a photoresist layer over the oxide layer, then etching the oxide layer with the photoresist layer to remove only a portion of the oxide layer, such that the area where the oxide layer still remains becomes a first area, with the photoresist layer overhanging the remaining oxide layer, and the area where the oxide layer is removed becomes a second area;

implanting ions into the substrate and forming an N-type well region in the second area, the remaining oxide layer and the photoresist layer serving as a mask to prevent the implanting of ions therebelow, the overhang of the photoresist layer causing the N-type well region to be laterally separated from the remaining oxide layer by a space;

removing the photoresist layer, and then forming a thermally formed oxide layer only over the second area and adjacent to the remaining oxide layer over the first area;

after said forming a thermally formed oxide layer, removing the remaining oxide layer above the first area and the thermally formed oxide layer above the second area such that the top surface of the substrate in the first area is at a higher level than the top surface of the substrate in the second area;

forming a pad oxide layer and a silicon nitride layer over the substrate; and patterning the silicon nitride layer to define an active device area.

2. The method of claim 1, wherein the step of forming the oxide layer includes a chemical vapor deposition method or a thermal oxidation method.

3. The method of claim 1, wherein the oxide layer has a thickness of about 800 Å to 3000 Å.

4. The method of claim 1, wherein the step of implanting ions into the substrate includes implanting phosphorus ions.

5. The method of claim 1, wherein the step of implanting ions includes implanting ions with an energy level of about 50 to 150 KeV and a dosage level of about $1.0 \times 10^{13}$ to $3.0 \times 10^{13}/cm^2$.

6. The method of claim 1, wherein the step of forming the thermally formed oxide layer includes a thermal oxidation method such that after the removal of the photoresist layer, the top surface of the substrate in the first area is higher than the top surface of the substrate in the second area.

7. The method of claim 1, wherein the thermally formed oxide layer has a thickness of about 300 Å to 1000 Å.

8. The method of claim 1, wherein the step of removing the remaining oxide layer above the first area and the thermally formed oxide layer above the second area includes a wet etching method.

9. The method of claim 1, wherein the step of etching the oxide layer includes using buffered hydrofluoric acid solution in a wet etching method.

10. A method for forming a well structure in an integrated circuit, comprising:

providing a substrate having an oxide layer formed directly, and without any intervening layers, thereon;

coating and patterning a photoresist layer over the oxide layer, then etching the oxide layer with the photoresist layer to remove only a portion of the oxide layer, such that the area where the oxide layer still remains becomes a first area, with the photoresist layer overhanging the remaining oxide layer, and the area where the oxide layer is removed becomes a second area;

implanting ions into the substrate and forming a P-type well region in the second area, the remaining oxide layer and the photoresist layer serving as a mask to prevent the implanting of ions therebelow, the overhang of the photoresist layer causing the P-type well region to be laterally separated from the remaining oxide layer by a space;

removing the photoresist layer, and then forming a thermally formed oxide layer only over the second area and adjacent to the remaining oxide layer over the first area;

after said forming a thermally formed oxide layer, removing the remaining oxide layer above the first area and the thermally formed oxide layer above the second area such that the top surface of the substrate in the first area is at a higher level than the top surface of the substrate in the second area;

forming a pad oxide layer and a silicon nitride layer over the substrate; and patterning the silicon nitride layer to define an active device area.

* * * * *